(12) United States Patent
Barthel et al.

(10) Patent No.: US 10,914,782 B2
(45) Date of Patent: Feb. 9, 2021

(54) TEST SYSTEM AND TEST METHOD FOR TESTING A DEVICE UNDER TEST

(71) Applicant: Rohde & Schwarz GmbH & Co. KG, München (DE)

(72) Inventors: Sven Barthel, Chemnitz (DE); Sebastian Petzsch, Chemnitz (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 80 days.

(21) Appl. No.: 16/397,735

(22) Filed: Apr. 29, 2019

(65) Prior Publication Data

US 2020/0341052 A1 Oct. 29, 2020

(51) Int. Cl.
*G01R 31/28* (2006.01)
*G01R 13/02* (2006.01)

(52) U.S. Cl.
CPC ......... *G01R 31/2837* (2013.01); *G01R 13/02* (2013.01); *G01R 31/2841* (2013.01)

(58) Field of Classification Search
CPC . G01R 31/2837; G01R 13/02; G01R 31/2841
USPC ................... 324/750.01, 537, 500
See application file for complete search history.

(56) References Cited

U.S. PATENT DOCUMENTS

| | | | |
|---|---|---|---|
| 3,813,599 A | 5/1974 | Campbell | |
| 8,583,388 B2* | 11/2013 | Yaguchi | G06F 30/367 702/60 |
| 2003/0016028 A1* | 1/2003 | Bass | F16L 53/37 324/642 |
| 2006/0097741 A1* | 5/2006 | Payman | G01R 31/70 324/762.03 |
| 2015/0145548 A1* | 5/2015 | Duncan | G01R 31/31905 324/756.05 |
| 2015/0160309 A1* | 6/2015 | Chou | G01R 33/0052 324/258 |
| 2015/0177300 A1* | 6/2015 | Paech | G01R 27/32 702/66 |
| 2017/0016953 A1 | 1/2017 | Beer | |

* cited by examiner

*Primary Examiner* — Giovanni Astacio-Oquendo
(74) *Attorney, Agent, or Firm* — Westman, Champlin & Koehler, P.A.

(57) ABSTRACT

The present invention relates to a test system for testing a device under test, comprising a signal generating unit being connectable to an input node of the device under test and being adapted to generate a test signal to be applied to the input node of the device under test, wherein the test signal comprises a plurality of frequency peaks at different frequencies. A receiving unit is connectable to an output node of the device under test and is adapted to receive a response signal from the device under test in response to the test signal. An analyzing unit for analyzing the device under test is adapted to determine at least one of a gain value and a phase value based on the test signal generated by the signal generating unit and the response signal received by the receiving unit.

19 Claims, 5 Drawing Sheets

TEST SYSTEM AND TEST METHOD FOR TESTING A DEVICE UNDER TEST

TECHNICAL FIELD

The present invention relates to a test system for testing a device under test, and a test method for testing a device under test.

BACKGROUND

To guarantee high quality standards, electronic devices are tested after production. A pre-defined electronic test signal is applied to the electronic device, in the following referred to as device under test, DUT. The response of the device under test is observed. The device under test will pass the quality test only if the response of the device under test fulfills certain preset conditions. Such tests are of particular importance in safety relevant fields, such as in the automotive, medical, aerospace or defense industry. Testing electronic devices may also become necessary at a later stage of the lifecycle of the electronic device, for instance if an error has occurred. Further, good knowledge of the electronic properties of an electronic device is also helpful during the developing stage.

One of the electronic properties to be tested is the bandwidth of the device under test. According to Document U.S. Pat. No. 3,813,599 A, signals of selectively determinable variations in repetition frequency may be provided and a signal with spectral frequency distributions varying as a function of the variations in repetition frequency is generated. The generated signal is applied to a circuit under test and the highest pulse repetition frequency producing detectable signals is taken as a measure of the bandwidth of the circuit under test.

Other important electronic characteristics of the device under test are the magnitudes and phase shifts of the frequency response of the device under test as the frequency of the test signal changes.

Testing equipment is expensive and a profound analysis of devices under test can be very time-consuming. Thus, there is a need to reduce the testing costs while ensuring that the analysis is still performed with high accuracy. A low-cost measurement device useful to analyze and characterize devices under test is known from US 2017/0016953 A1, the electronic measurement device comprising a signal generating unit adapted to apply a signal to a device under test, the signal having a frequency being adjustable by a controlling unit of the electronic measurement device. A receiving unit with a broad input bandwidth retrieves a signal from the device under test in response to the signal applied to the device under test. The broad input bandwidth allows to use modulated and/or broadband signals to analyze devices under test that comprise a low operating frequency.

Conventionally, at each moment the device under test is stimulated by a test system with a test signal having a single given frequency. Because of the settling times of the components of the test system, it takes a certain period of time until the signal is applied to the device under test. After the response of the device under test is measured, the frequency of the test signal changes. It therefore takes a certain time to perform a frequency sweep over a predetermined frequency range with a sufficient amount of measuring values.

Therefore, there is a need for faster test methods for testing devices under test without reducing the quality of the test.

SUMMARY

The present invention solves this problem by a test system for testing a device under test and a test method for testing a device under test having the features of the independent claims. Further embodiments are subject matter of the dependent claims.

According to a first aspect, a test system for testing a device under test is provided which comprises a signal generating unit, a receiving unit and an analyzing unit for analyzing the device under test. The signal generating unit is connectable to an input node of the device under test. The signal generating unit generates a test signal to be applied to the input node of the device under test. The test signal comprises a plurality of frequency peaks at different frequencies. The receiving unit is connectable to an output node of the device under test. The receiving unit is adapted to receive a response signal from the device under test in response to the test signal. The analyzing unit is adapted to determine a gain value and/or a phase value based on the test signal generated by the signal generating unit and the response signal received by the receiving unit.

According to a second aspect, a test method for testing a device under test is provided which comprises generating a test signal comprising a plurality of frequency peaks at different frequencies. The test signal is applied to an input node of the device under test. A response signal is received from an output node of the device under test in response to the test signal. The device under test is analyzed by determining a gain value and/or phase value based on the test signal and the response signal.

The invention proposes to test devices under test with test signals having a plurality of frequency peaks, i.e. more than one frequency peak. Each frequency peak corresponds to a distinct tone or frequency component and by measuring and analyzing the response of the device under test, the frequency response can be determined for each of these frequency components at the same time. Accordingly, the invention helps to parallelize the testing method which can significantly increase the speed of the testing method as compared to testing methods having test signals with single frequency peaks, only. At the same time, the frequency response can be separated and assigned to the respective frequencies. Therefore, the quality of the test is not reduced. The invention allows to substantially increase and optimize the test of the device under test.

It may even be possible to perform the test in real time if the device under test is tested at a sufficient number of frequencies at the same time. The device under test can be adjusted in real time during the measurement which can make development of electronic devices significantly faster. Also, repairing the device under test becomes easier if the result of certain actions can immediately be observed based on the frequency response.

A device under test may be any linear time invariant system or network, short LTI system, characterized by a linear and time invariant response to input signals. The device under test may be an amplifier, attenuator, active device, passive device or connecting element. The working frequency of the device under test may range from direct current, DC, up to several hundred MHz.

According to a preferred embodiment of the test system, the plurality of frequency peaks of the test signal forms a comb spectrum having a predefined spacing. A comb spectrum comprises several well-separated frequency peaks which can for example have equal or similar amplitudes. According to an embodiment, the peaks are separated insofar as amplitude of the peaks may be at least three times, five times, ten times, or 100 times higher as compared to intermediate peaks, e.g. originating from noise.

According to a preferred embodiment of the test system, the spacing is a logarithmic spacing. A logarithmic spacing is preferred for determining a bode plot which is generally plotted on a logarithmic scale. By using a logarithmic spacing, the same number of frequency peaks is provided for each decade. Accordingly, the device under test can be tested over a broad range of frequencies, for instance over a range from one or several Hz up to one or several GHz.

According to a preferred embodiment of the test system, the spacing is a linear spacing. In particular, the comb spectrum may comprise harmonics of a repetition frequency of the test signal. Accordingly, a harmonically distributed test signal is applied to the device under test. In addition to determining the gain value and/or phase value, a bandwidth of the device under test may be determined based on the highest frequency of the response signal which is detected by the analyzing unit.

According to a preferred embodiment of the test system, the spacing between adjacent frequency peaks of the test signal is higher than a resolution bandwidth of the receiving unit. The resolution bandwidth of the receiving unit may depend on the frequency, therefore the spacing may also be frequency dependent. By choosing the spacing of adjacent frequency peaks to be higher than a resolution bandwidth of the receiving unit, the frequency response can be determined for each distinct frequency corresponding to a respective frequency peak without any ambiguities. Accordingly, this condition specifies that the frequency peaks are sufficiently distinct from each other to obtain or reconstruct the entire frequency response.

According to a preferred embodiment of the test system, the signal generating unit is adapted to generate the test signal based on an inverse fast Fourier transformation, IFFT, of a predetermined target spectrum. The target spectrum may first be defined or modeled in the frequency domain and then be transformed into the time domain using IFFT. The transformed spectrum having the plurality of frequency peaks at different frequencies is then applied to the device under test. The generation of test signals using IFFT is particularly advantageous for arbitrary waveform generators being used as the signal generating unit because no cutoff signal periods occur.

According to a preferred embodiment of the test system, the signal generating unit is adapted to generate the test signal based on adding a plurality of periodic signals. Any number of periodic signals may be combined, for instance at least two signals, at least five signals or at least ten signals. According to an embodiment, at least some of the periodicities of the periodic signals differ from each other. For example, periodic signals may be combined having periodicities which are multiples of a reference periodicity. Further, at least some of the periodic signals may be phase shifted for adding additional phase information to the combined signal.

According to a preferred embodiment of the test system, the signal generating unit may also be adapted to generate the test signal based on multiplying a plurality of periodic signals.

According to a preferred embodiment of the test system, the plurality of periodic signals to be added and/or multiplied comprises sine wave signals. A multiplication of sine waves can be expressed in terms of an addition of sine waves, using well-known trigonometric identities.

According to a preferred embodiment of the test system, the signal generating unit is further adapted to generate the test signal using a window function. Multiplication with the window function can ensure that the test signal is a periodic function. Any window function may be used, e.g. a rectangular window, Lanczos window, B-spline window, polynomial window, sine window, a cosine-sum window (including a Hann and Hamming window, Blackman window, Nuttall window, continuous first derivative window, Blackman-Nuttall window, BlackmanHarris window, flat top window jor Rife-Vincent windows), an adjustable window (including a Gaussian window, confined Gaussian window, approximate confined Gaussian window, generalized normal window, Tukey window, Planck-taper window, DPSS or Slepian window, Kaiser window, Dolph-Chebyshev window, ultraspherical window, exponential or Poisson window) or a hybrid window (including a Bartlett-Hann window, Planck-Bessel window, Hann-Poisson window).

According to a preferred embodiment of the test system, the signal generating unit is an arbitrary waveform generator. The arbitrary waveform generator may be adapted to synthesize the test signal using digital signal processing techniques and to apply the test signal to the device under test.

According to a preferred embodiment of the test system, the receiving unit is adapted to use a plurality of Goertzel filters, wherein each Goertzel filter corresponds to one of the different frequencies corresponding to the frequency peaks of the test signal. Using Goertzel filters increases the speed of the signal analysis performed by the analyzing unit as compared to an analysis based on fast Fourier transformation, FFT.

According to a preferred embodiment of the test system, the receiving unit comprises a separate Goertzel filter for each of the different frequencies corresponding to the frequency peaks of the test signal.

According to a preferred embodiment of the test system, the plurality of Goertzel filters is hardware-implemented. For example, the receiving unit may comprise at least one digital signal processor, DSP, or an integrated current, e.g. a field programmable gate array, FPGA, implementing the plurality of Goertzel filters. According to further embodiments, the plurality of Goertzel filters may also be software-implemented.

According to a preferred embodiment of the test system, the analyzing unit is adapted to generate a bode plot using the at least one of the gain value and the phase value determined by the analyzing unit. The bode plot may comprise at least one of a bode magnitude plot and a bode phase plot. The bode magnitude plot corresponds to the graph of the absolute value of the transfer function corresponding to the response of the device under test as a function of the frequency of the test signal. The bode phase plot is the graph of the phase of the transfer function corresponding to the response of the device under test as a function of the frequency of the test signal. The bode plot is a convenient tool to illustrate the frequency response of the device under test to the applied test signal.

According to a preferred embodiment, the test system comprises a display for displaying the bode plot generated by the analyzing unit. The display may additionally display further information, e.g. configuration parameters of the test system or information regarding the device under test.

According to a preferred embodiment of the test system, the test system is an oscilloscope. The signal generating unit of the oscilloscope is preferably an arbitrary waveform generator.

According to a preferred embodiment of the method, a bode plot is generated using the gain value and/or using the phase value.

According to a preferred embodiment of the method, the bode plot is displayed on a display.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
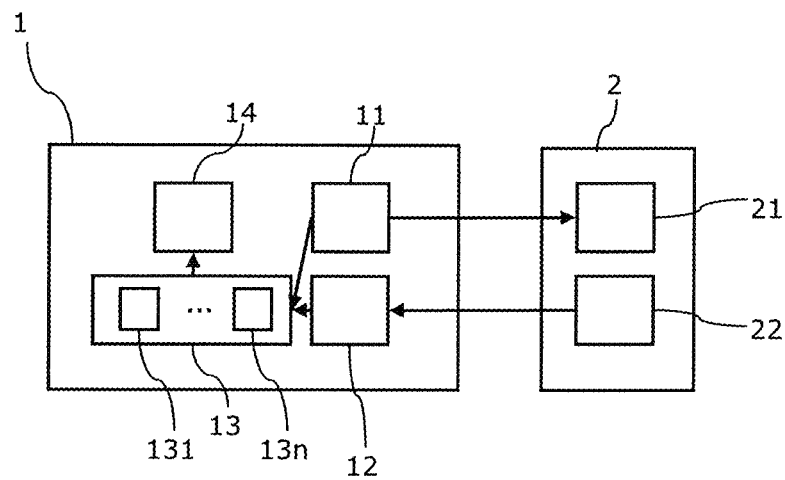
FIG. 1 shows a schematic block diagram of a test system according to an embodiment of the invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a schematic block diagram of a test system 1 for testing a device under test 2. The device under test 2 may comprise a printed circuit board having electronic components, e.g. discrete components such as coils or capacitors and integrated components such as microprocessors or ASICs.

The test system 1 may be an instrument adapted to receive and process data, examples being oscilloscopes, network analyzers, logic analyzers, and spectrum analyzers.

The test system 1 comprises a signal generating unit 11 which is electrically connected to an input node 21 of the device under test 2. The signal generating unit 11 is preferably an arbitrary waveform generator adapted to provide a test signal with a controllable spectrum. The test signal comprises several frequency peaks, e.g. at least one frequency peak per decade over a predefined frequency range. For example, the frequency range may extend from 1 Hz up to about 1 GHz. The test signal may also comprise a plurality of frequency peaks per decade. The frequency peaks are preferably logarithmically distributed, i.e. the spacing between adjacent frequency peaks follows a logarithmic distribution. The frequency peaks may also follow a linear spacing. The signal generating unit 11 may also be adapted to generate a test signal with randomly or pseudo-randomly distributed frequency peaks according to a predetermined or adjustable distribution, e.g. a logarithmic distribution.

The signal generating unit 11 applies the test signal to the input node 21 of the device under test 2. The device under test 2 further comprises an output node 22 which is electrically connected to a receiving unit 12 of the test system 1. A response signal is transferred from the output node 22 of the device under test 2 to the receiving unit 12 in response to the test signal applied by the signal generating unit 11 to the device under test 2.

The test system 1 further comprises an analyzing unit 13 which is electrically connected to the signal generating unit 11 and the receiving unit 12 and receives both the test signal generated by the signal generating unit 11 and the response signal received by the receiving unit 12. The analyzing unit 13 may comprise hardware elements, e.g. at least one processor or microprocessor. However, the analyzing unit 13 may also be at least partially software-implemented. Instructions may be stored in a memory that is coupled to a general purpose processor, e.g. via a memory bus. The analyzing unit 13 may be adapted to generate a gain value as a function of the frequency of the test signal and/or a phase value as a function of the frequency of the test signal corresponding to the frequency response of the device under test 2. For computing the gain value and/or phase value, the analyzing unit 13 may compare the test signal with the response signal. The analyzing unit 13 may generate output to be displayed on a display 14 of the test system 1. Additional information, comprising configuration data of the test system 1 or information regarding the device under test 2 may be displayed on the display 14.

For example, a bode plot may be displayed on the display 14, comprising a bode magnitude plot which expresses the magnitude of the frequency response as a function of the frequency of the test signal, and a bode phase plot which expresses the corresponding phase shift as a function of the frequency of the test signal.

The display 14 may further comprise a user interaction unit adapted to receive commands and signals from the user of the test system 1. The display 14 may for example comprise an input unit for receiving an input from a user of the test system 1, e.g. buttons, switches, a keyboard, or a touch screen which can be part of the display 14. The user may adjust the test signal using the user interaction unit. For example, the user may change the number of frequencies corresponding to the plurality of frequency peaks, may change specific positions of frequency peaks, i.e. select specific frequencies to be tested, or may adjust the spacing of the frequencies or the type of spacing between the frequencies. For example, the user may shift from a linear spacing to a logarithmic spacing. The user may also restrict the test signal to a certain frequency interval, allowing a detailed analysis of an interesting frequency region. After restricting, the total number of frequency peaks may remain constant, i.e. the spacing between adjacent frequencies may be reduced.

The analyzing unit 13 comprises a plurality of Goertzel filters 131 to 13n, wherein preferably one Goertzel filter 131 to 13n is provided for each measuring frequency, e.g. for each of the frequencies corresponding to the frequency peaks of the test signal. The Goertzel filters 131 to 13n may be implemented using a digital signal processor, DSP, or an integrated current, e.g. a field programmable gate array, FPGA. The Goertzel filters 131 to 13n are used in a Goertzel algorithm to efficiently evaluate individual terms of the discrete Fourier transformation generating gain values and phase values which are combined to a bode plot.

For generating the test signal, the signal generating unit 11 may apply several methods which are explained in the following with reference to FIGS. 2 to 8.

Figure 2:
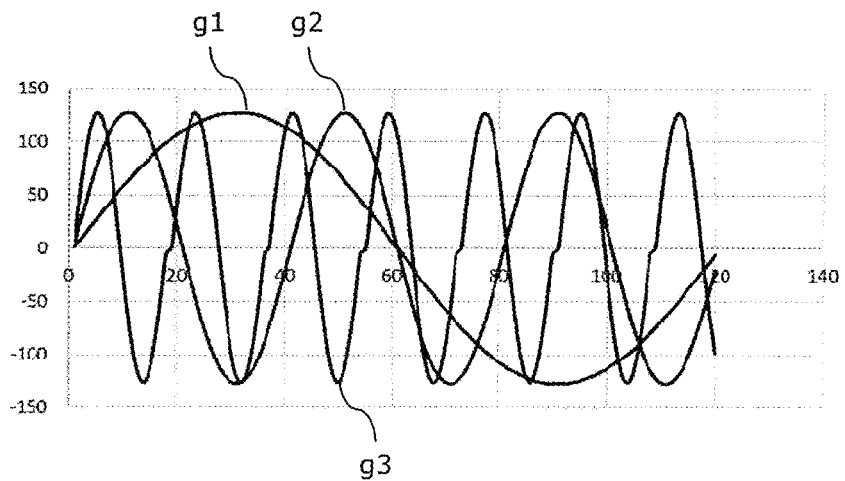
FIG. 2 shows three exemplary sine wave functions with different periodicities.

FIG. 2 shows three exemplary sine wave functions with different periodicities. A first sine wave function g1 has a predetermined period. The period of the second sine wave function g2 corresponds to one third of the period of the first sine wave function g1 and the period of the third sine wave function g3 corresponds to one seventh of the period of the first sine wave function g1. All three sine wave functions g1, g2, g3 have the same amplitude. The signal generating unit 11 may be adapted to add and/or multiply the basic sine wave functions g1, g2, g3 in order to generate further functions used as test functions or used to generate the test function.

Figure 3:
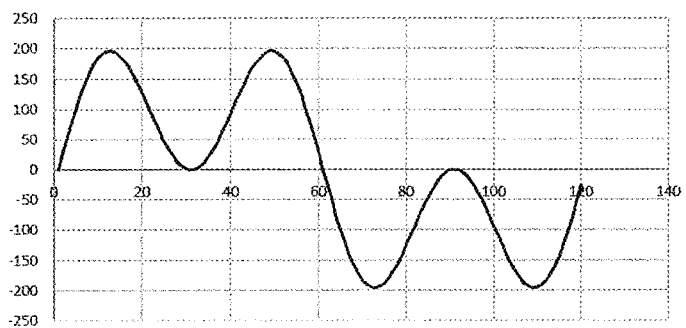
FIG. 3 shows a function obtained by multiplying a first of the three exemplary sine wave functions with a second of the three exemplary sine wave functions.
Figure 4:
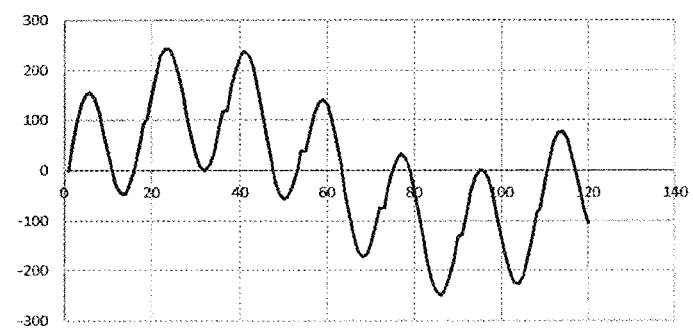
FIG. 4 shows a function obtained by multiplying the first of the three exemplary sine wave functions with a third of the three exemplary sine wave functions.
Figure 5:
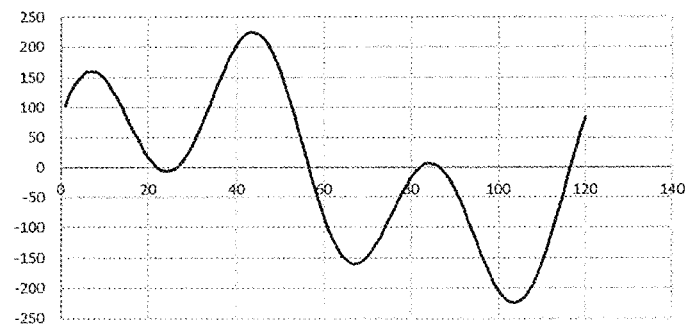
FIG. 5 shows a function obtained by multiplying the first of the three exemplary sine wave functions with the second of the three exemplary sine wave functions after a phase shift.

FIG. 3 shows an exemplary further function obtained by multiplying the first sine wave function g1 and the second sine wave function g2. FIG. 4 shows a function obtained by multiplying the first sine wave function g1 with the third sine wave function g3. FIG. 5 shows a function obtained by phase shifting the second sine wave function g2 and multiplying the first sine wave function g1 with the phase-shifted second sine wave function g2.

By adding or multiplying selected periodic functions, e.g. sine wave functions, the signal generating unit 11 may generate periodic functions in the time domain to be applied to the input node 21 of the device under test 2 as test signals.

Figure 6:
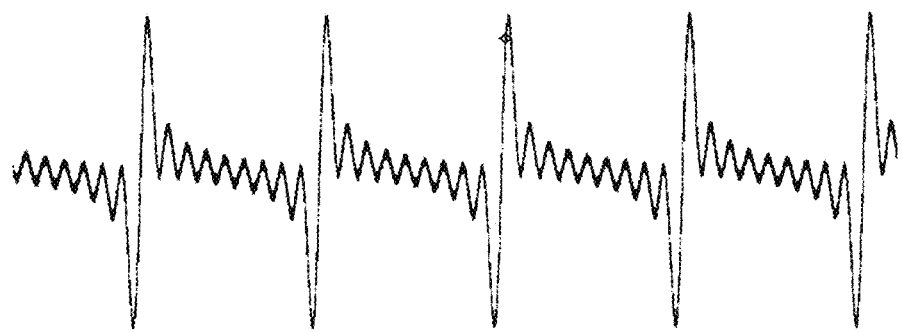
FIG. 6 shows a test signal generated based on adding sine wave functions.

FIG. 6 shows an exemplary test signal generated based on combining ten sine wave functions having equal amplitudes and corresponding to different harmonics. As can be seen, the test signal shows a comb spectrum with distinct and equally spaced peaks.

Figure 7:
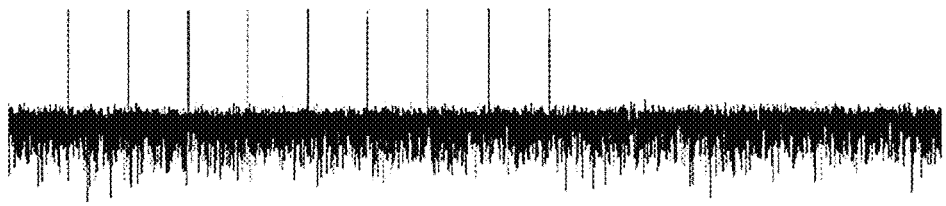
FIG. 7 shows the Fourier transform of the test signal shown in FIG. 6.

FIG. 7 shows the Fourier transform of the test signal shown in FIG. 6, illustrating the respective frequency components.

The signal generating unit 11 may be adapted to multiply the obtained function with a window function in order to generate a periodic test function.

Figure 8:
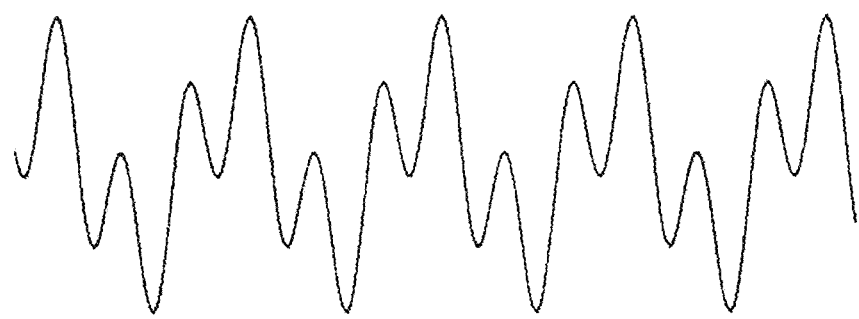
FIG. 8 shows a test signal obtained based on an inverse fast Fourier transformation.

The signal generating unit 11 may also be adapted to generate the test signal using inverse fast Fourier transformation, IFFT. FIG. 8 shows an exemplary test signal obtained based on an IFFT method. To generate the test signal, the signal generating unit 11 combines frequency components with a predetermined spacing. For example, the spacing may be a logarithmic spacing, a linear spacing or a random or pseudorandom spacing. Defined frequency components at defined phases are marked in a memory to generate a manually composed target spectrum having a real part and an imaginary part. A signal in the time domain is obtained which is exactly periodic with regard to the frequency components. Advantageously, the signal energy is distributed over the desired frequency components and no signal energy is lost. Another advantage is that a window function is generally not required. After determining the desired frequency components, the required spectrum is transformed into a signal in the time domain using IFFT. The signal generating unit 11 emits the signal with the respective basic frequency.

Figure 9:
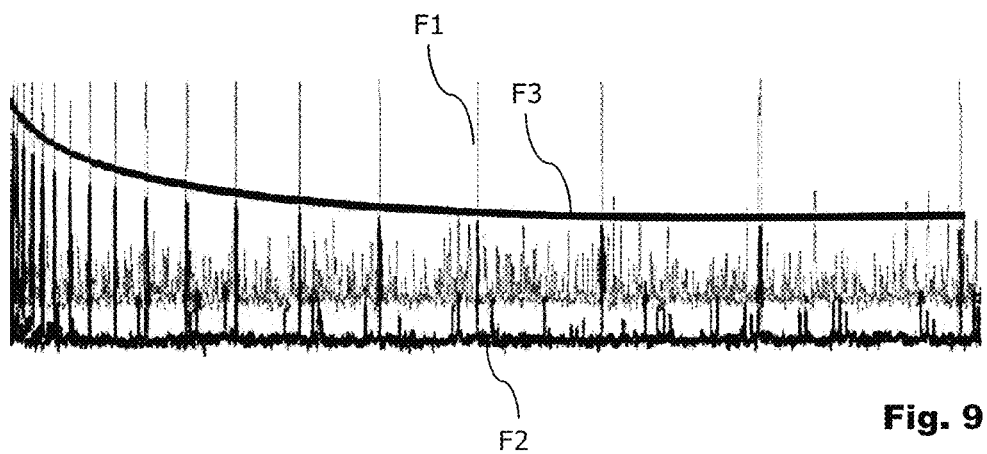
FIG. 9 shows a test signal applied to the device under test and a response signal received from the device under test.

FIG. 9 shows a test signal F1 applied to the device under test 2, i.e. the original spectrum of the signal emitted by the signal generating unit 11. FIG. 9 further shows a response signal F2 received from the device under test 2 which is characteristic of the frequency response of the device under test 2, the device under test 2 being a low pass filter. In addition, a curve F3 following the peak values of the response signal F2 is illustrated.

All measurements or results are simultaneously obtained. For example, the test signal may provide one measurement or frequency peak per decade. For each decade, two consecutive measurements may be performed. For each decade, there may be ten logarithmically spaced measurement points.

As an example, the lowest frequency of the test signal may be 100 Hz. Using a Goertzel filter corresponding to two periods, the update rate of the measurement corresponds to about 50 Hz, making the test system applicable almost in real time.

For generating the test signal, the signal generating unit 11 may preferably use a spacing between adjacent frequency peaks which is larger than the resolution bandwidth of the receiving unit 12.

Figure 10:
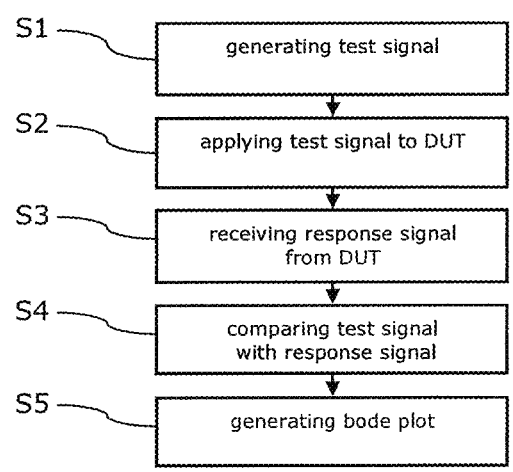
FIG. 10 shows a flow diagram illustrating a test method for testing a device under test according to an embodiment of the invention.

FIG. 10 shows a flow diagram illustrating a test method for testing a device under test according to an embodiment of the invention. The test method may be performed using a test system 1 according to an embodiment described above.

In a first method step S1, a test signal is generated. The test signal comprises a plurality of frequency peaks forming a comb spectrum. The spacing is preferably logarithmic. The test signal may be generated using a signal generating unit 11, e.g. an arbitrary waveform generator.

According to an embodiment, the test signal is generated by adding or multiplying a plurality of periodic signals, e.g. sine wave signals. The obtained signal may optionally be multiplied with a window function. According to a further embodiment, the test signal may be generated based on an inverse fast Fourier transformation of a predetermined target spectrum.

In a second method step S2, the test signal is applied to a device under test 2. The signal generating unit 11 may be connected via a probe to an input node 21 of the device under test 2. The device under test 2 may be any electronic component linear, in particular a time invariant system.

In a third method step S3, a response signal is received from the device under test 2 indicating the response of the device under test 2 to the test signal. The response signal may be received using a receiving unit 12 with a predetermined frequency-dependent resolution bandwidth. The spacing between adjacent frequency peaks is preferably higher than the resolution bandwidth of the receiving unit 12.

In a fourth method step S4, the test signal is compared with the response signal. Amplitudes and/or phases of the test signal and the response signal can be compared to determine an amplitude or gain value as well as a phase value of the frequency response of the device under test 2. For determining the gain value and/or phase value, a plurality of Goertzel filters may be provided. Preferably, each Goertzel filter corresponds to one of the different frequencies corresponding to the frequency peaks of the test signal. In particular, a separate Goertzel filter may be provided for each of the different frequencies corresponding to the frequency peaks of the test signal.

According to further embodiments, the form of the test signal may be adjusted by a user of the test system. In particular, the number of frequencies or the spacing of the frequencies or the type of spacing may be adjusted by the user.

In a fifth method step S5, a bode plot is generated, comprising the frequency dependency of the gain value and/or the frequency dependency of the phase value. The bode plot may be displayed to a user of the test system 1 on a display 14.

Summarizing, the invention provides a test system and a test method which allow to simultaneously measure multiple measurement points corresponding to different frequencies. Accordingly, the measurement may be performed in almost real time.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A test system for testing a device under test, wherein the test system comprises:

a signal generating unit being connectable to an input node of the device under test and being adapted to generate a test signal to be applied to the input node of the device under test, wherein the test signal comprises a plurality of frequency peaks at different frequencies;

a receiving unit being connectable to an output node of the device under test and being adapted to receive a response signal from the device under test in response to the test signal;

an analyzing unit for analyzing the device under test, the analyzing unit being adapted to determine at least one of a gain value and a phase value based on the test signal generated by the signal generating unit and the response signal received by the receiving unit.

2. The test system according to claim 1, wherein the plurality of frequency peaks of the test signal form a comb spectrum having a predefined spacing.

3. The test system according to claim 2, wherein the spacing is a logarithmic spacing.

4. The test system according to claim 2, wherein the spacing is a linear spacing.

5. The test system according to claim 2, wherein the spacing between adjacent frequency peaks of the test signal is higher than a resolution bandwidth of the receiving unit.

6. The test system according to claim 1, wherein the signal generating unit is adapted to generate the test signal based on an inverse fast Fourier transformation of a predetermined target spectrum.

7. The test system according to claim 1, wherein the signal generating unit is adapted to generate the test signal based on adding a plurality of periodic signals.

8. The test system according to claim 7, wherein the plurality of periodic signals comprises sine wave signals.

9. The test system according to claim 7, wherein the signal generating unit is further adapted to generate the test signal using a window function.

10. The test system according to claim 1, wherein the signal generating unit is an arbitrary waveform generator.

11. The test system according to claim 1, wherein the receiving unit is adapted to use a plurality of Goertzel filters, wherein each Goertzel filter corresponds to one of the different frequencies corresponding to the frequency peaks of the test signal.

12. The test system according to claim 11, wherein the receiving unit comprises a separate Goertzel filter for each of the different frequencies corresponding to the frequency peaks of the test signal.

13. The test system according to claim 11, wherein the plurality of Goertzel filters is hardware-implemented.

14. The test system according to claim 1, wherein the analyzing unit is adapted to generate a bode plot using the at least one of the gain value and the phase value determined by the analyzing unit.

15. The test system according to claim 14, further comprising a display for displaying the bode plot generated by the analyzing unit.

16. The test system according to claim 1, wherein the test system is an oscilloscope.

17. A test method for testing a device under test, wherein the test method comprises the steps:

generating a test signal comprising a plurality of frequency peaks at different frequencies;

applying the test signal to an input node of the device under test;

receiving, by a receiving unit of a test system, a response signal from an output node of the device under test in response to the test signal;

analyzing, by an analyzing unit of the test system, the device under test by determining at least one of a gain value and a phase value based on the test signal and the response signal, and generating output, by the analyzing unit.

18. The method according to claim 17, further comprising generating a bode plot using the at least one of the gain value and the phase value.

19. The method according to claim 18, further comprising displaying the bode plot on a display.

* * * * *